United States Patent
Thei et al.

(10) Patent No.: US 7,298,011 B2
(45) Date of Patent: Nov. 20, 2007

(54) SEMICONDUCTOR DEVICE WITH RECESSED L-SHAPED SPACER AND METHOD OF FABRICATING THE SAME

(75) Inventors: Kong-Beng Thei, Hsin-Chu (TW); Chung-Long Cheng, Hsin-Chu (TW); Harry Chuang, Austin, TX (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 18 days.

(21) Appl. No.: 11/215,103

(22) Filed: Aug. 30, 2005

(65) Prior Publication Data

US 2007/0045754 A1    Mar. 1, 2007

(51) Int. Cl.
*H01L 29/94* (2006.01)
(52) U.S. Cl. ............... 257/384; 257/408; 257/E29.122
(58) Field of Classification Search ............... 257/214, 257/288, 368, 377, 382–384, 408, 900, E29.122, 257/E29.134, E29.135, E29.136; 438/296, 438/592, 184, 230, 265, 303, 595
See application file for complete search history.

(56) References Cited

U.S. PATENT DOCUMENTS

| | | | |
|---|---|---|---|
| 5,783,479 A * | 7/1998 | Lin et al. ..................... | 438/592 |
| 6,251,764 B1 | 6/2001 | Pradeep et al. ............. | 438/595 |
| 6,265,271 B1 * | 7/2001 | Thei et al. ................... | 438/296 |
| 6,346,468 B1 | 2/2002 | Pradeep et al. ............. | 438/595 |
| 6,693,013 B2 | 2/2004 | Bae et al. .................... | 438/303 |
| 2001/0009291 A1 | 7/2001 | Miles ......................... | 257/382 |
| 2005/0124101 A1 | 6/2005 | Beintner ..................... | 438/197 |
| 2005/0242376 A1 * | 11/2005 | Chen et al. ................. | 257/214 |

* cited by examiner

*Primary Examiner*—Sue A. Purvis
*Assistant Examiner*—Benjamin Tzu-Hung Liu
(74) *Attorney, Agent, or Firm*—Thomas, Kayden, Horstemeyer & Risley

(57) ABSTRACT

A semiconductor device with a recessed L-shaped spacer and a method for fabricating the same. A recessed L-shaped spacer includes a vertical portion and a horizontal portion. The vertical portion is disposed on lower sidewalls of a conductor pattern, exposing upper sidewalls thereof. A top spacer is on the L-shaped spacer, wherein a width ratio of the vertical portion of the L-shaped spacer to the top spacer is at least about 2:1.

19 Claims, 5 Drawing Sheets

SEMICONDUCTOR DEVICE WITH RECESSED L-SHAPED SPACER AND METHOD OF FABRICATING THE SAME

BACKGROUND

The present invention relates in general to semiconductor manufacturing. More particularly, it relates to a semiconductor device with improved sidewall spacers and a method for fabricating the same.

Silicides are commonly used to reduce the gate resistance and the source/drain resistance between adjacent gate electrodes. As the physical geometry of semiconductor devices shrinks, however, the spacing between gate electrodes shrinks as well. The available space for silicide formation shrinks faster than the ground rules for gate-to-gate spacing due to the finite width of the gate spacers. Thus, the formation of silicide in narrow spaces between gates becomes more difficult, leading to an elevated and variable resistance in these regions. Furthermore, dry etching of conventional sidewall spacers is difficult to control and can result in variations in spacer width between adjacent gates. These variations in spacer width further result in poor resistance uniformity.

Referring now to FIG. 1, a cross-section of a partially completed semiconductor device is shown. Two transistor gate patterns 12 are formed overlying the semiconductor substrate 10. The gate patterns 12 include a gate electrode 14 overlying a gate dielectric 16. An oxide liner layer 18 and a silicon nitride layer 20 are deposited in sequence overlying the gate patterns 12 and the semiconductor substrate 10. Note that the silicon nitride layer 20 is much thicker than the oxide liner layer 18. For example, for 80 nm node design rule, the thicknesses of the silicon nitride layer 20 and the oxide liner layer 18 are about 650 Å and 130 Å, respectively.

Referring to FIGS. 2 and 3, conventional spacer etching is performed to provide an L-shaped oxide spacer 18a and a thicker nitride spacer 20a. After formation of source/drain regions 22, silicides 24 are formed on the exposed surface of the gate electrode 14 and the source/drain regions 22. As the available spaced for silicide formation is determined by the spacer widths, the variations in spacer width will result in poor resistance uniformity. With the conventional spacer scheme of FIG. 2, however, large variations in spacer width during spacer etching often necessitates complex process tuning. A novel spacer scheme with better width control is desirable. It is also desirable to reduce the spacer width to enlarge the space for silicide formation.

Another problem associated with conventional spacers is limited top loss. Referring back to FIG. 2, only a trivial sidewall portion of the gate electrode 14 is exposed after the spacer dry etching. With the finite exposed area, silicide is difficult to form to provide a high-performance transistor. It would be advantageous for the gate electrode to have a larger area for silicidation.

FIG. 4 shows yet another problem with conventional spacers. A contact hole 30 is etched though an inter-level dielectric (ILD) layer 28 and a contact etch stop layer 26 to expose the source/drain regions 22. As the stop layer 26 is typically silicon nitride, the nitride spacer 20a is laterally etched during the contact etching process for removal of the stop layer 26, leading to undercut 30a. The lateral etch poses reliability risks especially when the contact hole 30 is misaligned.

SUMMARY

According to one aspect of the invention, a semiconductor device with a recessed L-shaped spacers is provided. An exemplary device comprises a conductor pattern, an L-shaped spacer comprising a vertical portion and a horizontal portion, the vertical portion disposed on the lower sidewall of the conductor pattern, exposing upper sidewalls thereof, and a top spacer on the L-shaped spacer, wherein a width ratio of the vertical portion of the L-shaped spacer to the top spacer is at least about 2:1.

According to another aspect of the invention, a method for fabricating a semiconductor device with a recessed L-shaped spacer is provided. An exemplary method comprises forming a conductor pattern on a substrate, forming a first insulating layer and a second insulating layer conformally on the conductor pattern and the substrate at a thickness ratio of at least about 2:1, anisotropically etching the second insulating layer to form a top spacer, and anisotropically etching the first insulating layer to form an L-shaped spacer, wherein the top surface of the L-shaped spacer is recessed below the conductor pattern.

BRIEF DESCRIPTION OF THE DRAWINGS

For a better understanding of the present invention, reference is made to a detailed description to be read in conjunction with the accompanying drawings, in which.

DESCRIPTION

In the following, a preferred embodiment of the invention will be described by referring to formation of sidewall spacers on a gate pattern of a field effect transistor. It will be appreciated, however, that the invention is applicable to any conductor pattern in an integrated circuit, for example, local interconnection or other polysilicon lines for connecting individual semiconductor elements. In this specification, expressions such as "overlying the substrate", "above the layer", or "on the film" simply denote a relative positional relationship with respect to the surface of the base layer, regardless of the existence of intermediate layers. Accordingly, these expressions may indicate not only the direct contact of layers, but also, a non-contact state of one or more laminated layers.

Figure 5:
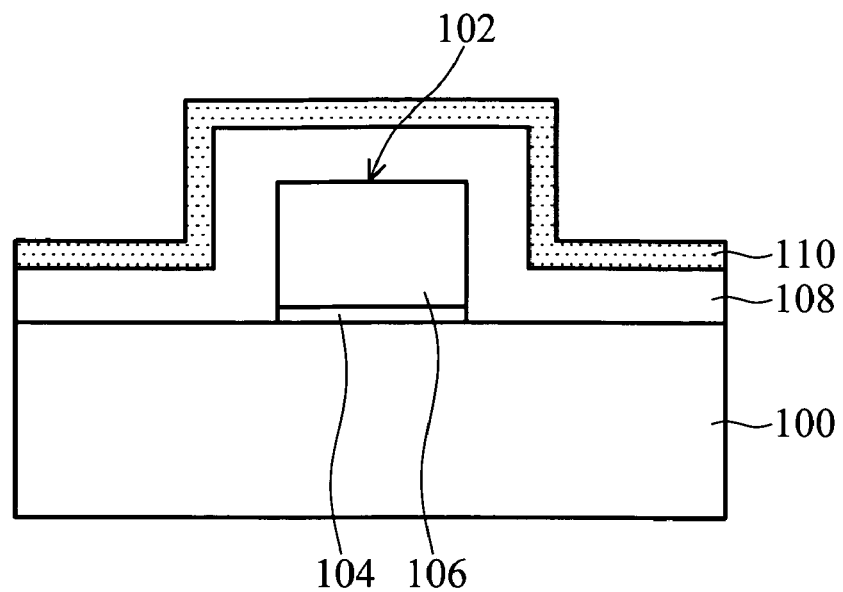
FIGS. 5 to 9 are cross-sections of a method of fabricating a recess L-shaped spacer according to an embodiment of the invention.

Referring now to FIG. 5, a semiconductor substrate 100 is provided with a transistor gate pattern 102 thereon. In FIG. 5, only one gate pattern is shown for the sake of clarity though adjacent gate patterns are typically present. The semiconductor substrate 100 is understood to possibly include silicon, strained silicon, silicon germanium (SiGe), silicon on insulator (SOI), or other suitable materials. The gate pattern 102 typically includes a gate electrode 106 overlying a gate dielectric 104. The gate dielectric 104 typically comprises silicon oxide, and the gate electrode 106 typically comprises doped polysilicon, often referred to simply as polysilicon.

Lightly doped source and drain (LDD) regions (not shown) may be formed by implanting impurity ions into the semiconductor substrate 100 prior to forming the sidewall spacers of the invention. The implant can be performed using the gate pattern 102 as an implant mask as is known in the art.

Still referring to FIG. 5, an important aspect of the invention is shown. A first insulating layer 108 and a second insulating layer 110 are conformally deposited overlying the gate pattern 102 and the semiconductor substrate 100, with the first insulating layer 108 being thicker than the second insulating layer 110. The thickness ratio of the first insulating layer to the second insulating layer is at least 2:1, preferably 2-4:1. For example, for 80 nm node technology, the thicknesses of the first and second insulating layers 108, 110 are about 350-450 Å and about 100-200 Å, respectively. Preferably in this embodiment, the first insulating layer is silicon oxide deposited by low pressure chemical vapor deposition (LPCVD) using tetraethoxysilane (TEOS) as the reactant gas, and the second insulating layer is silicon nitride or silicon oxynitride deposited by LPCVD. It will be appreciated, however, that the first and second insulating layers may be made of any materials having etch selectivity with respect to each other.

Figure 6:
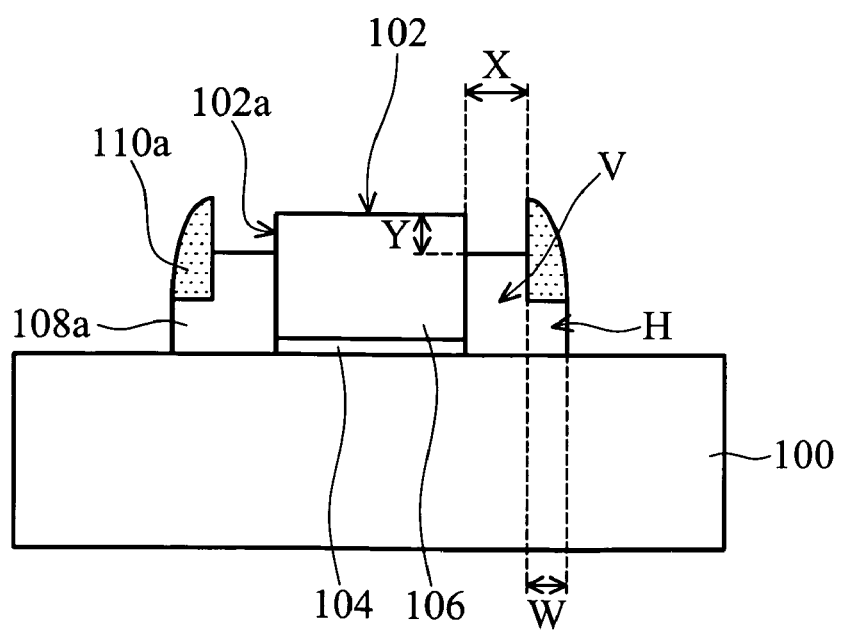

Referring to FIG. 6, another important feature of the invention is shown. The first and the second insulating layers 108, 110 are fabricated into a recessed L-shaped spacer 108a and a top spacer 110a, respectively. First, the second insulating layer 110 is anisotropically etched to form the top spacer 110a on sidewalls of the first insulating layer 108. Next, using the spacer 110a as an etch mask, the first insulating layer 108 is anisotropically etched to form an L-shaped spacer 108a positioned between the gate pattern 102 and the spacer 110a. In particular, the first insulating layer 108 is anisotropically etched down to reduce the vertical thickness thereof, thereby exposing a substantial portion of the upper sidewall 102a, for example, about 200-400 Å. The L-shaped spacer 108a includes a vertical portion V between the gate pattern 102 and the top spacer 110a, and a horizontal portion H extending under the top spacer 110a. The etching process for forming the L-shaped spacer is preferably carried out by a recipe having an etch selectivity with respective to the first insulating layer 108.

Figure 1:
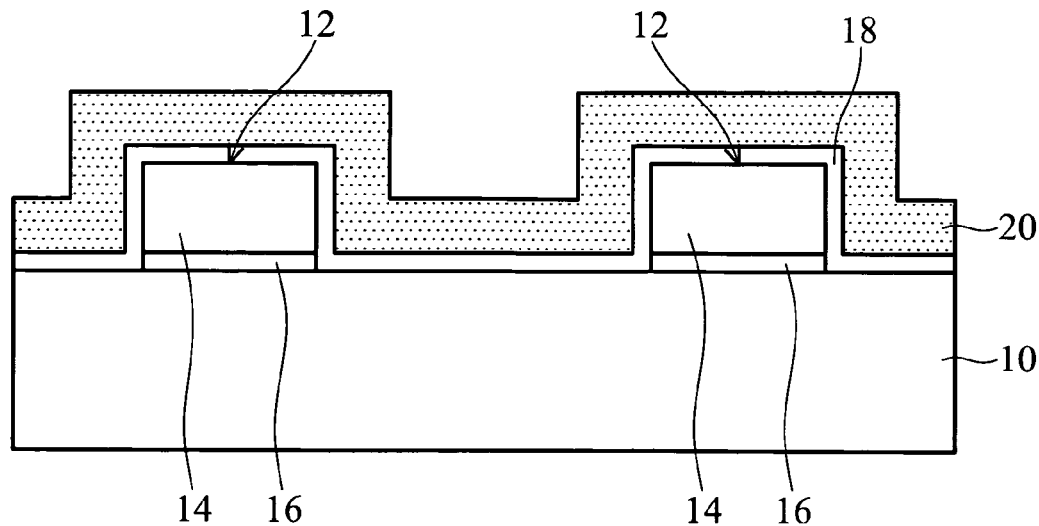
FIGS. 1 to 4 are cross-sections of a partially completed conventional semiconductor device, illustrating problems associated spacers thereof.
Figure 2:
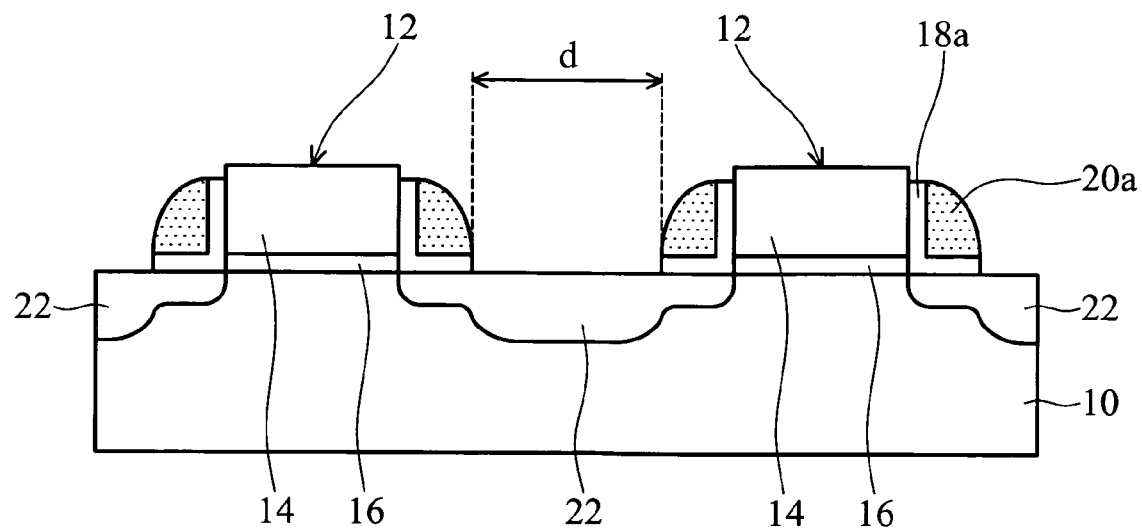
Figure 3:
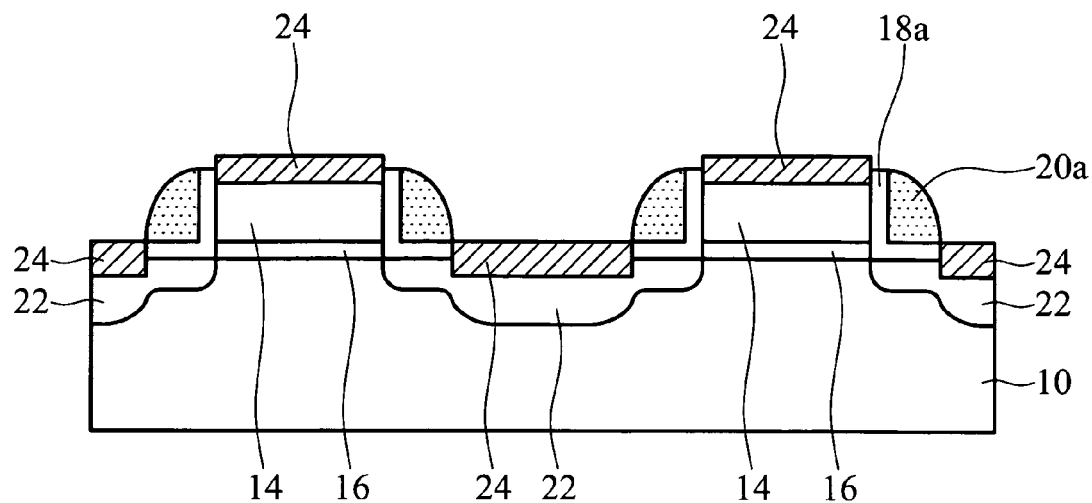
Figure 4:
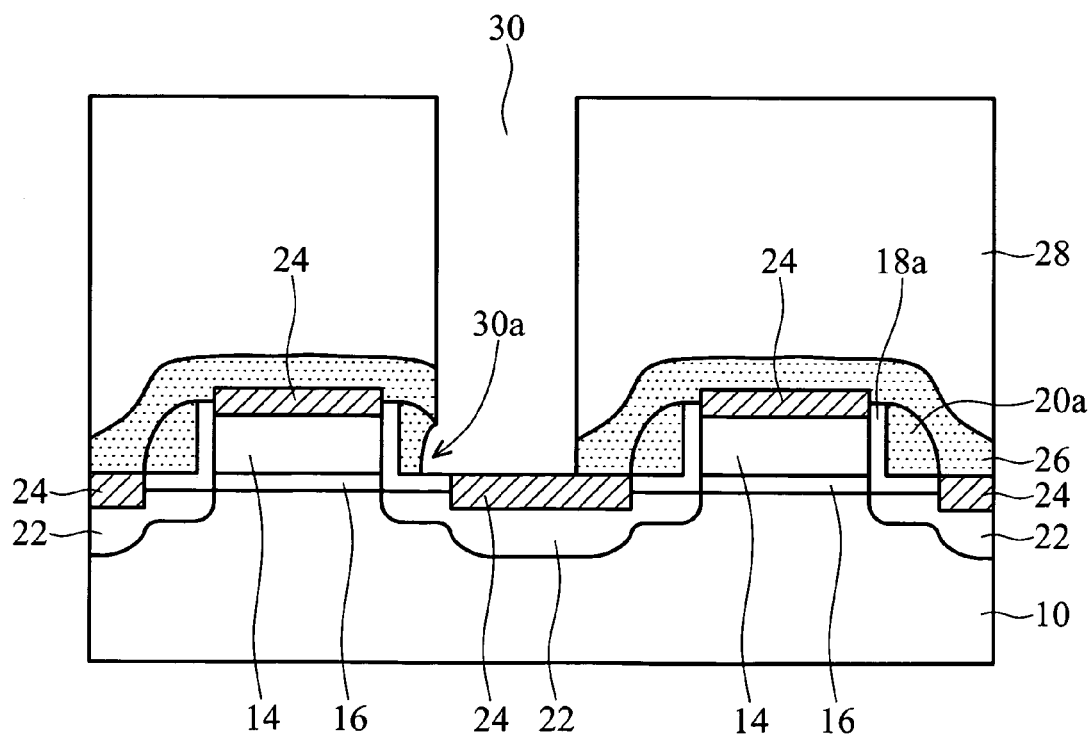

Compared to the conventional spacer process shown in FIGS. 1 and 2, the spacer process of the invention may provide many advantages. First, the thicker first insulating layer 108 enables easy removal of the top portion of the L-shaped spacer 108a. The L-shaped spacer 108a therefore can be recessed to expose a substantial sidewall portion 102a of the gate pattern 102, providing a larger silicide reaction area in a subsequent process. According to the invention, the ratio of the width X of the vertical portion V of the L-shaped spacer 108a to the height Y of the exposed sidewalls 102a is preferably about 1-2:1.

Second, as shown in FIGS. 5 and 6, the spacer profile is now determined by a thinner second insulating layer 110. Compared to the thick nitride layer 20 as in FIG. 1, it can be deposited with a more uniform thickness across a process wafer, and result in a short etching time or allow a lower etching power for the spacer etching process, thereby reducing variations in spacer widths. Accordingly, the spacer widths of the invention can be better controlled, and the resistance uniformity between adjacent gates can be improved.

Third, as the spacer widths are better controlled, a lower margin is required for spacer etching. Thus, the total thickness of the spacer layers, i.e., layers 108, 110, can be reduced to gain more space for silicidation between adjacent gates. This is particularly desirable when the gate spacing is reduced with the design rule. For example, for silicon oxide as the first insulating layer 108 and silicon nitride as the second insulating layer 110, the conventional approach of FIG. 1 requires a total thickness of 780 Å (oxide/nitride=130 Å/650 Å) for gate spacing of 1630 Å, while the invention only requires a total thickness of 530 Å (oxide/nitride=400 Å/130 Å) for the same design rule, saving about 30% thickness.

As shown in FIG. 6, the semiconductor device according to an embodiment of the invention therefore includes a gate pattern 102 on a semiconductor device 10. An L-shaped spacer 108a is provided adjacent to the gate pattern 102, comprising a vertical portion V and a horizontal portion H. The vertical portion V is on lower sidewalls of the gate pattern 102, exposing upper sidewalls 102a thereof. A top spacer 110a abuts the L-shaped spacer 108a, protruding above the same, thus providing a gap between the top spacer 110a and the upper sidewalls 102a of the gate pattern. The width ratio of the vertical portion V of the L-shaped spacer to the top spacer 110a is at least about 2:1 (X/W), preferably about 2-4:1. The width X of the vertical portion V to the height Y of the exposed upper sidewalls 102a is about 1-2:1 (X/Y).

Figure 7:
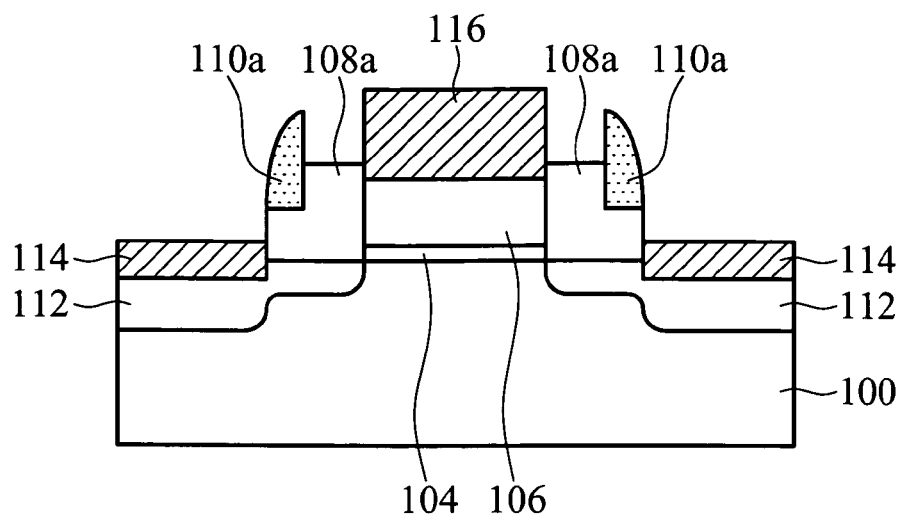

Referring to FIG. 7, following the formation of spacers 108a, 110a, source/drain regions 112 are formed in the substrate 100 oppositely adjacent to the gate pattern 102 by ion implantation. Subsequently, a gate silicide layer 116 and a junction silicide layer 114 are formed on the gate pattern 102 and the source/drain regions 112 by methods well known in the art. The silicide layers 114, 116 may comprise $CoSi_2$, $TiSi_2$, $WSi_2$, $NiSi_2$, $MoSi_2$, $TaSi_2$, or PtSi, for example. As discussed above, a sufficient silicidation area may be secured because the top surface of the L-shaped spacer 108a is recessed to expose upper sidewalls 102a of the gate pattern 102, and also because the space between two adjacent gates is more open. As a result, the silicide layers 114, 116 are more stably formed, and the gate silicide layer 116 is thicker than in the case of a non-recessed spacer 18a of FIG. 1.

Figure 8:
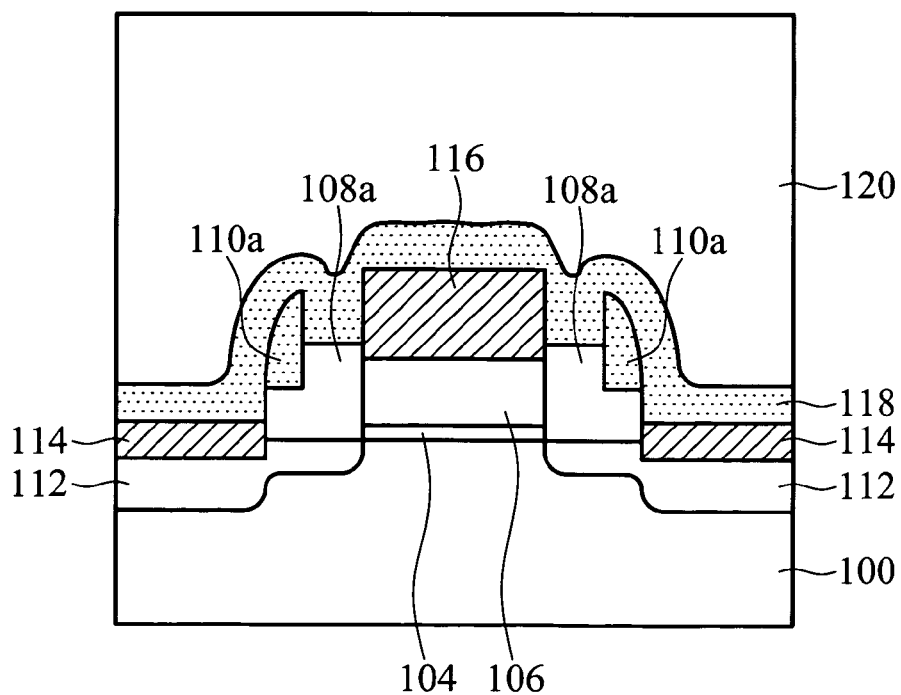
Figure 9:
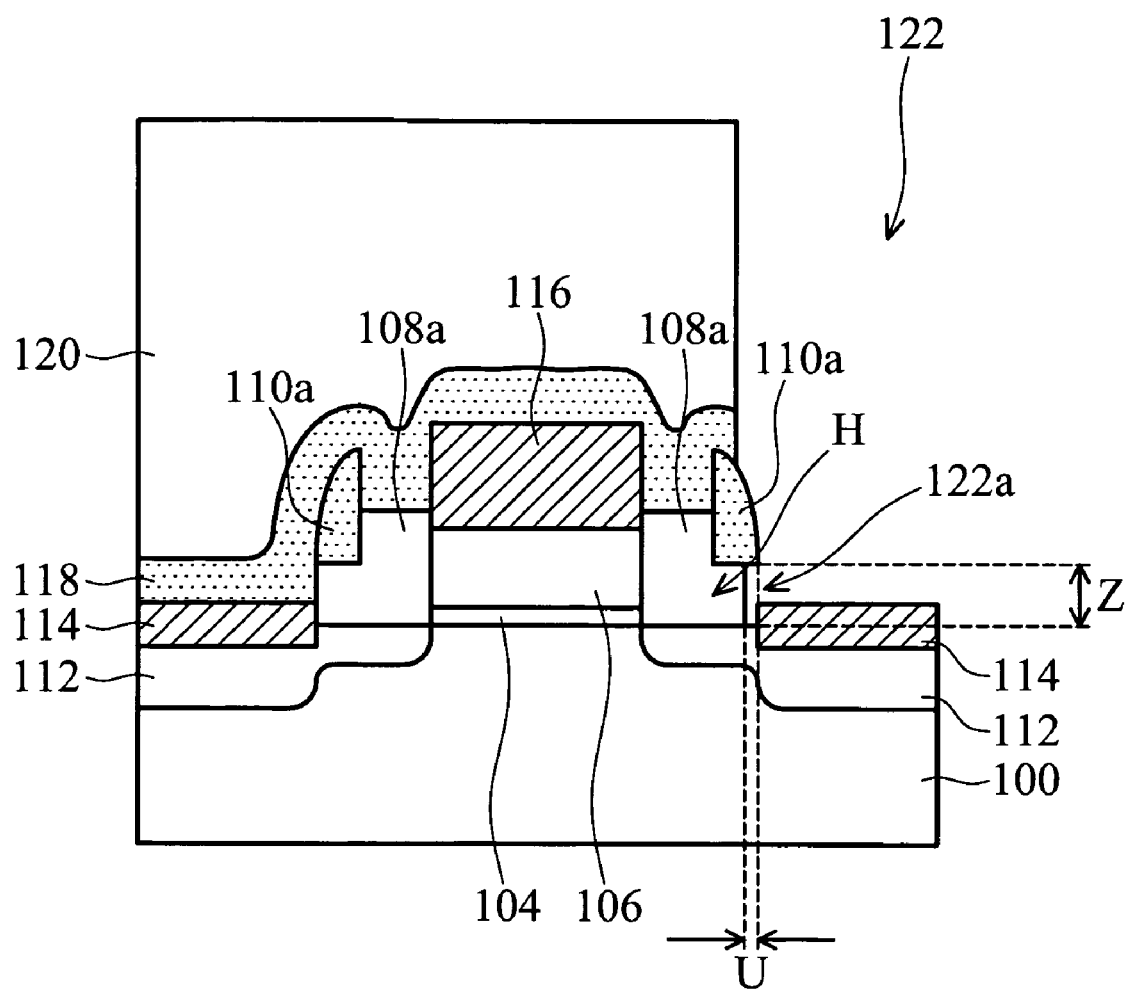

FIGS. 8-9 illustrate another advantage provided by the preferred embodiment of the invention. Referring to FIG. 8, following the formation of the silicide layers 114, 116, a contact etch stop layer 118 and an ILD layer 120 are deposited covering the entire substrate. The etch stop layer 118 is typically silicon nitride and the ILD layer 120 is typically oxide or low dielectric constant materials. Referring to FIG. 9, a contact opening 122 is etched down to the source/drain region 112 by conventional anisotropic etching. During removal of the nitride stop layer 118 from the source/drain regions 112, the horizontal portion H of the L-shaped spacer 108a, if oxide has been used, functions as an etch stop and inhibits lateral etching. Accordingly, only limited undercut, if any, is present under the top spacer 110a. In a preferred embodiment, the ratio of the width-U of the undercut to the height Z of the horizontal portion is less than about 0.3 (U/Z).

In view of the foregoing, it is readily appreciated that the present invention provides a simple and well-controlled spacer scheme to increase the area for silicide formation. Also, it may allow the spacer process down to the next generation design rule by reducing the spacer thickness. Further, the resulting spacer is less susceptible to undercut by lateral etching. Finally, The invention does not increase complexity of the spacer process. In the most simple way, it may merely change the thickness ratio of the spacer insulating layers of the current spacer scheme.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device with a recessed L-shaped spacer, comprising:
   a conductor pattern;
   an L-shaped spacer comprising a vertical portion and a horizontal portion, the vertical portion disposed on lower sidewalls of the conductor pattern, exposing upper sidewalls thereof; and
   a top spacer on the L-shaped spacer, wherein a width ratio of the vertical portion of the L-shaped spacer to the top spacer is at least about 2:1, wherein the width of the vertical portion is about 350-450 Å and the width of the top spacer is about 100-200 Å.

2. The semiconductor device of claim 1, wherein the conductor pattern is an interconnection pattern.

3. The semiconductor device of claim 1, wherein the conductor pattern is a gate pattern.

4. The semiconductor device of claim 1, wherein the conductor pattern comprises polysilicon.

5. The semiconductor device of claim 1, wherein the width ratio of the vertical portion of the L-shaped spacer to the top spacer is about 2-4:1.

6. The semiconductor device of claim 1, wherein a ratio of the width of the vertical portion to the height of the exposed upper sidewalls of the conductor pattern is about 1-2:1.

7. The semiconductor device of claim 1, wherein the horizontal portion is undercut under the top spacer, wherein a ratio of the width of the undercut to the height of the horizontal portion is less than about 0.3.

8. The semiconductor device of claim 1, wherein the L-shaped spacer and the top spacer are formed of materials having etch selectivity with respect to each other.

9. The semiconductor device of claim 1, wherein the L-shaped spacer comprises silicon oxide and the top spacer comprises silicon nitride or silicon oxynitride.

10. The semiconductor device of claim 1, wherein the conductor pattern is silicided.

11. A semiconductor device with a recessed L-shaped spacer, comprising:
    a gate pattern;
    an L-shaped spacer comprising a vertical portion and a horizontal portion, the vertical portion being on lower sidewalls of the gate pattern, exposing upper sidewalls thereof;
    a top spacer on the L-shaped spacer, protruding above the same, thereby providing a gap between the top spacer and the upper sidewalls of the gate pattern; and
    source/drain regions in the substrate oppositely adjacent to the gate pattern,
    wherein a width ratio of the vertical portion of the L-shaped spacer to the top spacer is at least about 2:1, and the width of the vertical portion to the height of the exposed upper sidewalls is about 1-2:1, wherein the width of the vertical portion is about 350-450 Å and the width of the top spacer is about 100-200 Å.

12. The semiconductor device of claim 11, wherein the gate pattern comprises a gate electrode on a gate dielectric.

13. The semiconductor device of claim 11, wherein the width ratio of the vertical portion of the L-shaped spacer to the top spacer is about 2-4:1.

14. The semiconductor device of claim 11, wherein the horizontal portion is undercut under the top spacer, wherein a ratio of the width of the undercut to the height of the horizontal portion is less than about 0.3.

15. The semiconductor device of claim 11, wherein the L-shaped spacer and the top spacer are formed of materials having etch selectivity with respect to each other.

16. The semiconductor device of claim 11, wherein the L-shaped spacer comprises silicon oxide and the top spacer comprises silicon nitride or silicon oxynitride.

17. The semiconductor device of claim 11, wherein the gate pattern and the source/drain regions are silicided.

18. The semiconductor device of claim 11, further comprising an etch stop layer and an interlevel dielectric layer overlying the gate pattern and the substrate.

19. The semiconductor device of claim 11, wherein about 200-400 Å of the gate pattern is exposed by the vertical portion of the L-shaped spacer.

* * * * *